(12) United States Patent
Gleissner et al.

(10) Patent No.: US 11,938,522 B2
(45) Date of Patent: Mar. 26, 2024

(54) MODULE FOR CHEMICALLY PROCESSING A SUBSTRATE

(71) Applicant: SEMSYSCO GMBH, Salzburg (AT)

(72) Inventors: Andreas Gleissner, Döbriach (AT); Herbert Ötzlinger, Hallwang (AT); Raoul Schröder, Neuenstein (DE); Oliver Knoll, Salzburg (AT)

(73) Assignee: SEMSYSCO GMBH, Salzburg (AT)

( * ) Notice: Subject to any disclaimer, the term of this patent is extended or adjusted under 35 U.S.C. 154(b) by 0 days.

(21) Appl. No.: 17/787,876

(22) PCT Filed: Dec. 1, 2020

(86) PCT No.: PCT/EP2020/084037
§ 371 (c)(1),
(2) Date: Jun. 21, 2022

(87) PCT Pub. No.: WO2021/121949
PCT Pub. Date: Jun. 24, 2021

(65) Prior Publication Data
US 2023/0226578 A1 Jul. 20, 2023

(30) Foreign Application Priority Data
Dec. 20, 2019 (EP) .................................... 19218508

(51) Int. Cl.
*B08B 3/02* (2006.01)
*B08B 3/08* (2006.01)
(Continued)

(52) U.S. Cl.
CPC ................. *B08B 3/02* (2013.01); *B08B 3/08* (2013.01); *B08B 3/12* (2013.01); *B08B 2203/02* (2013.01);
(Continued)

(58) Field of Classification Search
CPC .... B08B 3/12; B08B 3/08; B08B 3/02; B08B 2203/02; H01L 21/67086; H01L 21/67057
See application file for complete search history.

(56) References Cited

U.S. PATENT DOCUMENTS 6,240,938 B1   6/2001  Oshinowo
7,931,035 B2*  4/2011  Park .......................... B08B 3/02
                                                            134/186

(Continued)

FOREIGN PATENT DOCUMENTS

EP    2924720 A1    9/2015
JP    2000308857 A  11/2000
(Continued)

OTHER PUBLICATIONS

Office Action in European Application No. 19218508.0, dated Nov. 26, 2020, 6 pages.
(Continued)

*Primary Examiner* — Benjamin L Osterhout
(74) *Attorney, Agent, or Firm* — Meunier Carlin & Curfman LLC (57) ABSTRACT

The invention relates to a module for chemically processing a substrate, a method for chemically processing a substrate and a use of a module for chemically processing a substrate and in particular a large substrate. The module for chemically processing a substrate comprises: an immersion chamber, a spray unit, and a motion unit (14). The immersion chamber is configured to receive a first liquid and the substrate, so that the substrate is immersed in the liquid. The spray unit comprises a plurality of spray nozzles, which are configured to spray a second liquid within the immersion chamber. The motion unit is configured to provide a relative motion between the substrate and the spray unit.

19 Claims, 7 Drawing Sheets

(51) Int. Cl.
*B08B 3/12* (2006.01)
*H01L 21/67* (2006.01)

(52) U.S. Cl.
CPC .. *H01L 21/67057* (2013.01); *H01L 21/67086* (2013.01)

(56) References Cited

U.S. PATENT DOCUMENTS

| | | | |
|---|---|---|---|
| 2002/0144708 A1* | 10/2002 | Kashkoush | B08B 3/02 134/186 |
| 2003/0133851 A1 | 7/2003 | Kitahara | |
| 2003/0188765 A1* | 10/2003 | Christenson | H01L 21/6708 134/28 |
| 2004/0050405 A1 | 3/2004 | Christenson et al. | |
| 2008/0000495 A1* | 1/2008 | Hansen | H01L 21/67253 134/1 |
| 2008/0156348 A1 | 7/2008 | Mimken et al. | |
| 2008/0163890 A1* | 7/2008 | Rosato | C11D 11/007 134/1 |
| 2011/0168211 A1* | 7/2011 | Park | B08B 3/02 134/26 |
| 2013/0167876 A1 | 7/2013 | Takeaki et al. | |
| 2014/0314957 A1 | 10/2014 | Minami et al. | |

FOREIGN PATENT DOCUMENTS

| | | |
|---|---|---|
| JP | 2009125734 | 6/2009 |
| JP | 2010125375 | 6/2010 |
| JP | 2011165694 A | 8/2011 |
| WO | 2003050861 A1 | 6/2003 |
| WO | 2019047140 A1 | 3/2019 |

OTHER PUBLICATIONS

Office Action in European Application No. 19218508.0, dated May 27, 2021, 3 pages.
Intention to Grant in European Application No. 19218508.0, dated Oct. 21, 2021, 39 pages.
Korean Office Action and English translation thereof issued in corresponding Korean Patent Application No. 10-2022-7010347, dated Mar. 28, 2023.
Singaporean Written Opinion issued in corresponding Singapore Patent Application No. 11202114070V, dated Apr. 19, 2023.
International Search Report and Written Opinion filed in International Application No. PCT/EP2020/084037, dated Jan. 28, 2021, 15 pages.
Extended European Search Report filed in European Application No. 22156530.2, dated May 17, 2022, 8 pages.
Extended European Search Report filed in European Application No. 19218508.0, dated Jun. 5, 2020, 10 pages.
Japanese Office Action and English Translation thereof issued in Japanese Patent Application No. 2022-508518, dated Mar. 7, 2023, 7 pages.
Office Action and English translation thereof issued for Korean Application Application No. 10 2022 7010347, dated Jul. 26, 2023, 7 pages.
Office Action and English translation thereof issued for Japanese Patent Application No. 2022 508518, dated Aug. 8, 2023, 8 pages.

* cited by examiner

MODULE FOR CHEMICALLY PROCESSING A SUBSTRATE

FIELD OF THE INVENTION

The invention relates to a module for chemically processing a substrate, a method for chemically processing a substrate and a use of a module for chemically processing a substrate and in particular a large substrate.

BACKGROUND OF THE INVENTION

Multi-purpose or so called "All-in-One" process chambers for mainly liquid chemical processing of substrates should enable the application of diverse process technologies (e.g. liquid spray and immersion type processing combined with rinsing and drying functions) within the same process chamber. They should allow achieving outstanding on substrate process results without the need for moving the substrate to be processed from one chamber to another. However, the realization of such multi-purpose chambers pose huge problems, which have hindered their introduction until the present. Prominent examples of problems/challenges are:

(1) Unwanted chemical mixing in the chemical drain caused by the inability to separate the chemistries efficiently after each of the individual processing steps.

(2) Inefficient chemical recovery for reuse of some or all of the chemistries, which leads to very high chemical consumption and with this to a very high CoC (Cost of Consumable) for the equipment.

(3) Chemical cross contamination through chemical residues in the process chamber because of inefficient and ineffective rinsing capabilities (complex mechanical designs and implementations within the chamber cause areas, which are difficult to rinse effectively from chemical residues) and lead to high DI (deionized) water consumption (high CoC).

(4) Exhaust system complexity, potentially creating chemical cross contaminations, forming residues and salt depositions everywhere in the equipment (especially when using incompatible chemicals in subsequent processing steps like acids and bases). Especially salt depositions in the exhaust pipes are leading to potentially unsafe situations as well as unwanted contamination of the substrates. An additional problem exists when implementing also solvent applications in the process flow (flammable or non-flammable solvents).

(5) Inefficient and potentially substrate contaminating, as well as very slow drying processes leading to yield loss and very long process times and low substrate throughput per hour respectively (high CoO, Cost of Ownership)

(6) Non-uniform temperature distribution and cooling effects on the chemistry due to chamber and airflow design, as well as chamber and substrate size.

There have been several systems proposed to overcome these limitations in the past, but none of the prior art was successful.

SUMMARY OF THE INVENTION

Hence, there is a need to provide an improved module for chemically processing a substrate, which enables the application of various process technologies within a single processing unit in order to achieve outstanding substrate process results.

The problem is solved by the subject-matters of the independent claims, wherein further embodiments are incorporated in the dependent claims. It should be noted that the aspects of the invention described in the following apply also to the module for chemically processing a substrate, the method for chemically processing a substrate and the use of a module for chemically processing a substrate.

According to the present invention, a module for chemically processing a substrate is presented. The module for chemically processing a substrate comprises an immersion chamber, a spray unit, and a motion unit.

The immersion chamber is configured to receive a first liquid and the substrate, so that the substrate is immersed in the liquid. The spray unit comprises a plurality of spray nozzles, which are configured to spray a second liquid within the immersion chamber. The first and second liquids can be same or different. The motion unit is configured to provide a relative motion between the substrate and the spray unit.

As a result, an "All-in-One" multi-purpose module or process chamber for liquid processing is provided, which is able to integrate and combine diverse process technologies. For example, the application of immersion type processing, liquid spray processing (sequentially or at the same time/in parallel) and, optionally, ultrasonic agitation within the same chamber is possible. In addition, an efficient and effective rinsing and drying without the need to move the substrate in-between different processing vessels is achieved. The "All-in-One" multi-purpose module allows, at the same time, accelerating many procedures and improving the product quality, while costs are still reduced. Further, many different substrate sizes may be processed without the need of mechanical changes to the chamber.

The spray nozzles of the spray unit are preferably arranged such that the second liquid is sprayed on the substrate in a thickness direction of the substrate, which means substantially frontal in the thickness direction of the substrate. In particular, the spray nozzles are configured to spray the second liquid substantially perpendicular or normal to a substrate surface to be treated. "Substantially perpendicular" can be understood not spraying of the liquid parallel to the substrate and preferably in a range of 70° to 110° to a surface of the substrate. Thus, dead angles or flow crossing points on the substrate are reduced or prevented, thereby improving a uniform distribution of the second liquid on the surface of the substrate. Compared to spraying the liquid from the side, namely parallel to the substrate, a substantially perpendicular spray significantly increases the impact energy of the chemical spray onto the substrate surface to be treated. Thus, a significant reduction of the boundary layer thickness is achieved. This means that it is possible to significantly reduce the thickness of a highly viscos layer of the first chemical contacting the surface. Reducing the boundary layer thickness allows, e.g. the easier removal of particles embedded in this viscos boundary layer. Thinning the boundary layer may result in a faster chemical exchange, meaning, the mixing of the second chemical with the first chemical is significantly faster, if the chemical spray is targeted onto the surface in a substantially perpendicular direction.

In general, adjusting the impact energy by selecting the spray volume and spray energy directed to the surface may allow the tuning of the boundary layer thickness. In some cases, it might be advantageous to reduce the boundary layer thickness only slightly, e.g. when large particles are embedded within the boundary layer and the boundary layer has been formed on the surface with very small and fragile structures. In this way, the large particles can still be removed through a significantly high impact energy of the second liquid and at the same time, the fragile structures are protected by the still sufficiently thick viscos boundary layer of the first chemical. In other cases, it might be required to remove very small particles embedded within the boundary layer while rather large and not so sensitive device structures are present on the substrate surface. In this case, a substantially perpendicular chemical spray with extremely high impact energy might be appropriate to remove such particles. The same applies for exchanging or mixing the first chemical by or with the second chemical, e.g. when only a slow mixing of both chemicals is required, or e.g. a fast chemical quenching is required to very abruptly slow down or even stop a chemical reaction between the first chemical and the material or materials on surface of the substrate.

The implementation of a combined chemical (liquids, vapors and gases) and physical processing (agitation and motion between substrate and spray unit) system may enhance many procedures to chemically process a substrate. For example, it becomes possible to combine the so far not integratable processing steps (1) photo resist develop, (2) etch and (3) photo resist removal within one chamber. In particular, the photo resist removal can be enhanced and accelerated without significant material loss of an underlying layer.

The module is configured to chemically process at least one substrate, which may be held in a substrate holder. The substrate may be processed on one or both sides. The substrate holder may also hold two substrates, which then can be processed simultaneously by the module according to the invention.

In an embodiment, the module for chemically processing a substrate further comprises an ultrasonic unit or acoustic agitation unit configured to provide ultrasound to agitate the first liquid in the immersion chamber. The term "ultrasound" may be understood as describing a frequency range from a kHz to a lower MHz range. The ultrasound range may comprise 10 kHz to 100 MHz, preferably 80 kHz to 10 MHz, more preferably 900 kHz to 3 MHz.

The ultrasonic unit or acoustic agitation unit may comprise one transducer, e.g., a full area transducer, or a plurality of smaller transducers. There might be two or three or four ultrasound units. They may be dispersed over two or three or four outer surfaces of the immersion chamber. Of course, also larger numbers are possible. The transducer(s) may be directly connected and attached to the immersion chamber or indirectly by means of a transducer plate or the like.

In an embodiment, the ultrasound unit is arranged at an outer surface of the immersion chamber. In other words, it can be mounted on an outside of the immersion chamber in a way, that an acoustic propagation can be achieved from behind nozzle- or spray bars of the spray unit through open spaces in-between the nozzle or spray bars. Of course, also an attachment to an inner surface of the immersion chamber is possible. In another embodiment, the ultrasound unit and the spray unit are at least partially arranged at a removable plate element configured to be moved relative to the immersion chamber. For example, some ultrasonic transducers and some spray nozzles can be arranged at the plate element, which is separate from the immersion chamber wall. The plate element can be moveable within the immersion chamber and also in and out of the immersion chamber. In all cases, the ultrasonic unit may comprise a plurality of ultrasound transducers, which are arranged between adjacent spray bars.

The motion unit is configured to provide a relative motion between the substrate and the spray unit. The motion unit may therefore move the substrate (potentially including a substrate holder) and/or move the spray unit, in particular the spray nozzles and/or spray bars.

In an embodiment, the motion unit is configured to move the substrate relative to the immersion chamber and the spray unit in a first direction, which can be understood as a Z-direction vertically in and out of the immersion chamber. In an embodiment, the motion unit is configured to additionally or alternatively move the substrate relative to the immersion chamber in another or second direction, which can be understood as an X-direction different and in particular perpendicular to the first direction. The second or X-direction may be understood as horizontally in the direction of thickness of the substrate, the growth of the applied layer and from a front side to a back side of the substrate. In an embodiment, the motion unit is further configured to move the substrate relative to the immersion chamber in a still another or third or Y-direction, which is perpendicular to the first direction and the second direction. The third or Y-direction can be understood as horizontally in the direction of width of the substrate. A movement or agitation of the substrate or a substrate holder in Z-and/or Y-direction further allows reducing or eliminating shadowing effects of ultrasound radiation from the immersion chamber wall to the substrate through e.g. spray bars of the spray unit and equilibrates a spray uniformity over a substrate surface. A distance of the substrate to the ultrasonic radiation source might be controlled depending on the frequency range applied for the process.

The spray unit comprises a plurality of spray nozzles, which are configured to spray a liquid to e.g. clean the substrate. There might be only one or two spray units. A larger number of spray units is also possible.

In an embodiment, the spray nozzles are at least partially arranged in a wall of the immersion chamber. In other words, the spray nozzles may be integrated into the wall of the immersion chamber, which can be ultrasonically agitated.

In an embodiment, the spray unit is configured to spray the second liquid in a spray direction, which is non-perpendicular tilted relative to a substrate and/or a wall of the immersion chamber. The wall of the immersion chamber might be parallel to substrate to be treated. The spray unit and in particular the spray nozzles may be configured to spray the second liquid in a spray direction, which is directed towards a bottom of the immersion chamber. Preferably, the spray direction is tilted in a range of 20° to 70° relative to the substrate and/or a wall of the immersion chamber and more preferably about 45° relative to the substrate or the wall. The spray unit or the spray nozzles may be configured to spray the second liquid in a spray direction, which is tilted in Z-direction (in and out direction of the immersion chamber) and/or angled in Y-direction (along the width of the substrate). A tilt in Z-direction additionally enables residual chemicals to drain out through the spray nozzles after processing through gravity draining. In other words, the spray nozzles might be tilted down for e.g. 45° and angled to the side for e.g. 25°. The spray nozzles might be fixedly installed with a tilt or might be moveable by the motion unit to show a variation in a tilt angle.

In an embodiment, the spray nozzles are alternatively or additionally to the integration in the chamber wall at least partially arranged in spray bars, which are arranged in the immersion chamber. The term "spray bar" can be understood as a hollow rod with several openings working as spray nozzles and/or as a hollow rod with at least one slit at least partially extending along a longitudinal direction of the rod (slit bar). In an embodiment, the motion unit or another device is configured to move at least some of the spray bars relative to the substrate or the wall of the immersion chamber. The movement of the spray bars may be configured to allow a draining of liquids from the spray bars. Therefore, the motion unit may be configured to rotationally tilt at least some of the spray bars in a non-horizontal position. Also, a 360° rotation may be possible. The liquid can then, e.g., be drained into a recirculation tank in particular before a clearing rinsing with e.g. water. This may help to avoid an inefficient chemical recovery for reuse of some or all chemistries, which would lead to a high chemical consumption and with this to a very high CoC (Cost of Consumable) for equipment.

As stated above, the motion unit or another device may move a spray bar or spray nozzle relative to the substrate or the wall of the immersion chamber in a rotational movement around a longitudinal axis of the spray bar. The motion unit or another device may additionally or alternatively move a spray bar or spray nozzle relative to the substrate or the wall of the immersion chamber in a fanning movement perpendicular to the longitudinal axis of the spray bar. This can be understood as a left—right movement when looking along the Y-direction (width of the substrate and the immersion chamber) and/or an up—down movement when looking along the Z-direction (in and out direction of the immersion chamber). The fanning movement range may be between 10° and 40°, preferably between 20° and 30°. The rotational movement and the fanning movement can be conducted simultaneously or alternating, which means combined or one after the other. Such movements allow a spray nozzle down position to have residual chemicals draining out through the spray nozzles after a processing is finished, which means a spray bar emptying before e.g. a rinsing process to reduce chemical dilution and waste. An advantage of the fanning movement is that a movement or agitation of the substrate holder and the substrate along the Y-direction can be reduced or completely avoided, which results in an easier design and manufacturing for the handling system.

The tilt of the spray nozzles or spray bars or the motion of the spray nozzles or spray bars into a tilted position may allow a smart chemical draining from the spray bars into e.g. a recirculation tank before a clearing rinsing with e.g. water. There are several options to achieve the tilt. For example, the spray nozzles are tilted relative to the spray bar or the spray nozzles are tilted relative to the chamber wall or the spray bars are tilted relative to chamber wall or the like. Also, combinations are possible.

In an embodiment, in a row of adjacent first, second and third spray nozzles, the first and third spray nozzles are tilted in a similar direction relative to each other, while the second spray nozzle is arranged and tilted differently or in a different direction compared to the first and third spray nozzles. In this context, a row of spray nozzles may extend along the Z-direction and/or along the Y-direction. In other words, the differently tilted or oriented spray nozzles may be nozzles arranged above or aside to each other.

Having a spray nozzle arrangement comprising several rows of spray nozzles (arranged in the immersion chamber wall or a spray bar), the spray nozzles may be horizontally and vertically aligned. Alternatively, the spray nozzles might be vertically aligned for every second spray row or spray bar. There might be a displacement between the spray nozzles of adjacent spray rows of e.g. half a distance between adjacent spray nozzles of the same spray row.

The spray unit or the spray nozzles or the spray bars might be arranged within the immersion chamber. They might extend along the substrate to be processed. There might be an additional cleaning unit, bar or nozzle, which extends above the other "normal" spray nozzles or spray bars and the substrate to be processed. This additional cleaning unit, bar or nozzle may be configured to clean the lower "normal" spray nozzles or spray bars and the substrate. The additional cleaning unit, bar or nozzle may therefore be provided with a nozzle row directed into the opening of the immersion chamber and/or a nozzle row directed to the other, lower spray nozzles or spray bars and/or also have the capability of a fanning movement as described above.

The module for chemically processing a substrate may further comprise a fast fill inlet or valve, which is configured for a fast filling of the immersion chamber. The term "fast" can be understood in this context as e.g. less than 10 seconds for 20 liters of liquid. The module for chemically processing a substrate may alternatively or additionally be filled by means of the spray unit and in particular the spray bars.

In an embodiment, the module for chemically processing a substrate further comprises a valve unit with several valves. Each valve is connected to a separate tank or drain. The valves might be configured for liquid drain and gas exhaust (switches). The valve unit may be configured for a quick chemical drain, which enhances the process uniformity. Quick can be understood in this context as e.g. below 10, 5 or 3 seconds for 40 to 60 liters of liquid. The valve unit helps to avoid an unwanted chemical mixing in the chemical drain which could be caused by the inability to separate the chemistries efficiently after each of the individual processing steps. The valve unit may be a valve block for drain control and in particular, a so-called quick dump and rinse (QDR) valve block.

The valve unit or valves may be arranged at a bottom or lower end of the immersion chamber. The chamber bottom may be sloped towards the valve. The lowest point for liquids inside the module might be inside the valve. As a result, gravity drain is used and can still be enhanced by optional suction to enhance the drain speed. There might be one, two or three valves. Also, a larger number is possible. Generally, there might be at least $n+1$ valves, wherein n is the number of different liquids to be used. There might also be at least $n+2$ or $n+3$ valves. The additional valve(s) might be exhaust valve(s) for e.g. each side wall of the immersion chamber.

In an embodiment, the module for chemically processing a substrate further comprises an exhaust unit. The exhaust unit may lead to an effective and efficient exhaust flow during e.g. a substrate drying by providing a predefined atmospheric pressure gradient from the outside of the processing chamber towards the exhaust system on fabrication level in order to avoid chemical fumes to contaminate the outside of the processing chamber and in the worst case the fabrication level. The fabrication level is defined as the environment in which one, several or many tools are operated simultaneously. As a result of a well working exhaust unit on the equipment level, chemical cross contaminations, chemical residues and salt formations within the equipment and, especially in the exhaust pipes leading from the equipment level to the exhaust system on the fabrication level, which could lead to potentially unsafe situations and also contaminations of the substrates, are avoided. The exhaust unit may comprise one, two, at least two or more exhausts. In an example, an upper and a bottom exhaust is provided, which can be used depending on an operation mode. In an immersion mode, the upper exhaust is used, which is arranged over or above the liquid level. The upper exhaust may be an "all around"—exhaust in an upper area of the immersion chamber, preferably just below an idle exhaust.

In a spray mode, the bottom exhaust may be preferably used, which is arranged at the bottom of the immersion chamber.

Each exhaust and in particular the bottom exhaust can comprise one or more exhaust valves. At least one exhaust valve can be opened and closed or, in other words, can be switchable between an open state and a closed state. As different and also incompatible chemicals can be used with the all-in-one chamber, the exhaust valve(s) can then be switched between e.g. acid, base and neutral media. At least one or all of the valves can be a two way valve or a three way valve or a combination thereof. The valve may be rinseable, closeable and/or ventilated.

The exhaust unit may also comprise at least an exhaust line with the capability of being rinsed, flushed or filled with a liquid or gas. In an example, the exhaust line up to a switch point between the equipment level and the fabrication site level can be cleaned with e.g. water. This can be done by filling the exhaust line with water or other liquid from the process chamber or by spraying water or other liquid into the exhaust line or the like. In case of more than one exhaust line, an exhaust valve can be switched to different exhaust lines. In other words, an exhaust valve may be switched between a first exhaust line and a second exhaust line.

To remove the cleaning water or other cleaning liquid from the exhaust line, a drain line can be provided and connected to (preferably the lowest point and/or the lowest common point of) the exhaust line or exhaust lines. The drain line can be switchable by means of a valve configured to switch the drain on and off. As the exhausts can be switched on and off and can be switched between e.g. acid and base, the load for the exhaust line at fabrication level can change significantly, which could be a problem for the overall management of the exhaust system on the fabrication level including other systems and tools. To mitigate this situation, the exhaust unit on the equipment level may further comprise a bypass that can be opened in case the exhaust is not used by the chamber and/or can be regulated by an exhaust regulation system on equipment level depending on the exhaust load.

The module for chemically processing a substrate may further comprise a liquid separator arranged in a lower part of the module and the exhaust unit. The liquid separator may assist to avoid a clogging of the system and in particular of the exhaust unit, preferably even without the need of a rinse unit.

In an embodiment, the module for chemically processing a substrate further comprises a drain, rinse and dry unit. The drain, rinse and dry unit can be understood as a unit configured for draining and/or rinsing and/or drying. In other words, it is not necessary that all functions are provided. The drain, rinse and dry unit may be configured for a rinsing in-between the application of different chemicals by e.g. spray rinsing, overflow rinsing with/without ultrasonic agitation, combination of spray and overflow rinsing, waterfall-rinsing, waterfall-chemical processing, waterfall quenching and the like. The rinse and dry unit may comprise four valves arranged at two opposite sides of the immersion chamber. For example, the drain, rinse and dry unit may additionally or alternatively provide for a waterfall-chemical processing of the substrate, which means providing for water or chemicals to flow from top of the substrate to the bottom by the action of gravity. The drain, rinse and dry unit may be used to quench or stop a chemical reaction.

The drain, rinse and dry unit may also be configured to rinse and clean the immersion chamber. At least a part of the drain, rinse and dry unit can be arranged on top or in an upper part of the immersion chamber and/or on top or in an upper part of a chamber cover unit to allow a cleaning of the immersion chamber and/or a chamber cover unit. In other words, a cover rinsing is possible, which means the uppermost or an additional spray or nozzle bar may be implemented for rinsing the movable cover elements. This might be done by a two-side oriented spray direction with a liquid level overflow below the top two spray or nozzle bars. In other words, a top spray or nozzle bar for rinsing the cover unit may be configured for two different spray directions. A second spray or nozzle bar, the one below the top one may spray in the direction of the substrate. The top two spray or nozzle bars can alternatively also have the capability of a fanning movement as described earlier. There might be a guiding plate configured to guide the liquids or gases provided by the drain, rinse and dry unit and/or to improve the flow. The drain, rinse and dry unit may help to avoid a chemical cross contamination through chemical residues in the process chamber. This is achieved by its efficient and effective rinsing capabilities, which may also handle complex mechanical designs within the chamber, which are conventionally difficult to rinse from chemical residues and would otherwise lead to a high DI (deionized) water consumption and high CoC.

The drain, rinse and dry unit may be further configured to blow and/or to suck liquid and/or gas in and/or out of the immersion chamber and/or the spray unit. The drain, rinse and dry unit may e.g. allow a back suction of liquids from e.g. the spray bars and/or spray nozzles. The drain, rinse and dry unit may additionally or alternatively allow a blow-out of chemicals from the spray bars or any kind of nozzle tubes. The drain, rinse and dry unit may also enable a back-suction and blow out simultaneously. As a result, an efficient chemical recovery for reuse of some or all of the chemistries is enabled, which means lesser consumption of chemicals and reduced CoC.

The drain, rinse and dry unit may be further configured for an efficient and effective drying of the substrate and/or substrate holder. This can for example be done by a laminar flow from top down while the substrate and/or substrate holder moves (repeatable) through a drying zone on top of the immersion chamber. The laminar flow can be understood as being provided by air-knifes. The air-knifes might be fixed or non-fixed/moveable for different substrate and substrate holder geometries. The air-knifes can be gas-knifes with a gas different to air. There might be additional exhaust opening(s) behind the air-knifes for exhaust optimization during drying. Further, there might be e.g. two additional valves at bottom sides of the immersion chamber for exhaust during a drying only step. These additional valves might be closed during other processing steps. As a result, an inefficient drying process and/or a potentially substrate contaminating and/or slow drying process is avoided, which leads to shorter process times and higher substrate throughput per hour.

In an embodiment, the drain, rinse and dry unit comprises a temperature controlling element configured to heat or cool the liquid and/or gas to be blown or sucked through the immersion chamber and/or the spray unit. The temperature controlling element might be configured to heat e.g. a pre-rinse liquid to get the entire module up to temperature before the actual chemistry is being dispensed. The temperature controlling element might also be configured to heat e.g. a post-rinse liquid to avoid a cooling of the entire module between different process steps. The temperature controlling element might also be a chamber heating for heating or cooling at least one of the chamber walls. As a result, the temperature controlling element helps to avoid a non-uniform temperature distribution within and along the substrate surface, the immersion chamber and/or the spray unit. In particular, it helps avoiding cooling effects on or by or through the chemistry due to chamber and airflow design, chamber and substrate size.

In an embodiment, the module for chemically processing a substrate further comprises a chamber cover unit comprising several cover elements, preferably moveable cover elements, for example four cover elements. The cover elements are configured to close an opening in the immersion chamber to a closed position. The cover elements are further configured to surround a substrate while transferred through the opening in close contact in a transfer position. The cover elements are further configured to open the opening to an open position. This means, the cover elements may move or flap aside to open the opening.

In an embodiment, the chamber cover unit is additionally configured to entirely open the opening to an entirely open position. In contrast to the previously described normal "open" position, the chamber cover unit is for the "entirely open" position provided with an additional degree of freedom to open the immersion chamber completely in order to e.g. avoid turbulent air flow areas in top corners of the immersion chamber. The additional degree of freedom means that in addition to a cover movement in Y-direction coupled to the motion unit and its substrate handling/agitation in Y-direction an additional cover movement in X- and/or Y-direction is possible, independent from the motion unit and its substrate handling/agitation to open the immersion chamber on top completely. This entirely open position is in particular favorable for drying, substrate in/out-handling, maintenance and repair of the module and the like.

The moveable cover elements might be pushed against the immersion chamber, each other and/or a substrate contained in the immersion chamber. The pushing force may be applied by means of at least a spring, a pneumatic cylinder, a hydraulic cylinder and/or the like. When pushing the moveable cover elements against the substrate, a gap might open between the moveable cover elements and a rim of the immersion chamber. The gap might not be mechanically closed, but controlled by a flow of sealing air or another sealing gas to prevent a contaminating gas flow from the inside of the immersion chamber to the outside. The flow of sealing air/gas may therefore be directed from the outside to the inside of the immersion chamber. The flow of sealing air/gas may be in a range of 3 to 10 m/s, preferably about 5 m/s. Another option to control the gap between the moveable cover elements and the rim of the immersion chamber is a corresponding use of the exhaust unit to provide a flow of sealing air/gas from the outside to the inside of the immersion chamber to prevent a contaminating gas flow from the inside to the outside.

The cover elements might be sealed against the immersion chamber or a rim or contact surface of the immersion chamber. The sealing can be done by means of sealing elements as e.g. at least an elastic lip, a labyrinth seal and/or the like. The sealing might be liquid tight and/or gas tight. The chamber cover unit with the optional sealing allows reducing or eliminating chemical contamination to the environment and in particular a chemical splashing to the outside of the immersion chamber.

In an embodiment, the chamber cover unit further comprises a processing element configured to control a movement of the chamber cover elements depending on motion data received from the motion unit controlling the relative motion between the substrate and the spray unit. In other words, the cover unit or element(s) can be moved integral or together with the substrate motion system in e.g. X and/or Y-direction. This correlating movement may be based on motion data transmitted by a mechanical coupling or by a motor control of at least an e.g. electro motor moving the chamber cover elements or the like.

In an embodiment, the module for chemically processing a substrate further comprises a lifting unit configured to lift at least a portion or side or corner of the immersion chamber to drain liquid out of the spray unit. The immersion chamber may be lifted e.g. on one side in the Y-direction by a few degrees, so liquids or chemicals through gravity drain out of "initially" horizontal tubes or bars, which are then tilted in a non-horizontal direction. As a result, the lift or tilt of the immersion chamber may allow a draining from the immersion chamber, the spray bars and so on to save the chemicals. Consequently, chemical recovery for reuse of some or all of the chemistries is made far more efficient, which means lesser consumption of chemicals and reduced CoC.

In an embodiment, the module for chemically processing a substrate further comprises a shield unit configured to shield an array of the plurality of spray nozzles. The shield unit may also direct fluid or gas flows to e.g. protect certain areas, rinse hardly accessible areas, drain in a directed manner etc.

According to the present invention, also a method for chemically processing a substrate is presented. The method for chemically processing a substrate comprises the following steps, not necessarily in this order:
 inserting a first liquid and a substrate into an immersion chamber, so that the substrate is immersed in the liquid,
 removing the first liquid from the immersion chamber,
 spraying a second liquid within the immersion chamber by means of a spray unit comprising spray nozzles, and
 relatively moving the substrate and/or the spray unit by means of a motion unit.

In an embodiment, the method for chemically processing a substrate further comprises a step of providing ultrasound to agitate the first liquid.

In an embodiment, the spraying of the second liquid is done while the substrate is at least partially immersed in the first liquid. This means, the immersion and the spraying may take place at the same time. The spraying may take place before removing the first liquid from the immersion chamber.

In an embodiment, the method for chemically processing a substrate further comprises the step of removing the substrate out of the immersion chamber while rinsing or cleaning the immersion chamber for a subsequent processing of the same substrate. Additionally, also a rinsing and/or a drying step of the substrate is possible while the substrate is in the empty immersion chamber as well as outside the immersion chamber or passaging the opening of the immersion chamber. Further, the substrate might be continuously sprinkled during its removal out of the immersion chamber. The sprinkling may be done with any liquid and in particular with changing liquids, e.g., first a chemical, second water. In addition, a quenching (stopping) of the chemical reaction or reactions on the substrate surface (e.g. when changing the liquid), a cooling or a heating of the substrate is possible.

According to the present invention, also a use of the above described module for chemically processing a substrate is presented. Above described module can in particular be used for a large substrate with dimensions in a range of 300×300 mm and larger. Preferably, a diagonal or diameter is equal to or larger than 350 mm, more preferably 500 mm, even more preferably 800 mm, and still even more preferably 1000 mm.

It shall be understood that the module, the use, and the method according to the independent claims have similar and/or identical preferred embodiments, in particular, as defined in the dependent claims. It shall be understood further that a preferred embodiment of the invention can also be any combination of the dependent claims with the respective independent claim.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the accompanying drawing.

DETAILED DESCRIPTION OF EMBODIMENTS

Figure 1A:
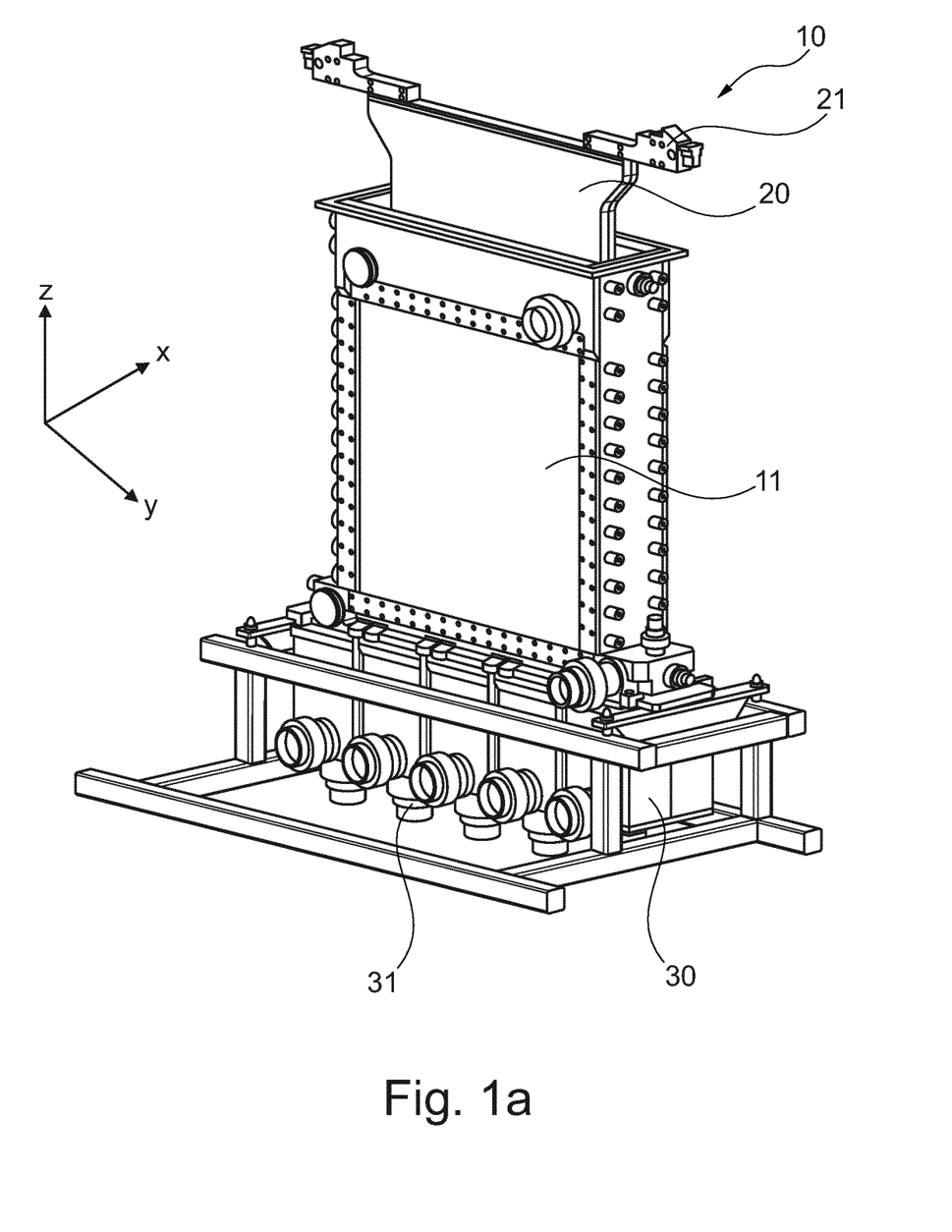
FIGS. 1a,b show schematically and exemplarily embodiments of a module for chemically processing a substrate according to the invention.

FIGS. 1a,b show schematically and exemplarily embodiments of a module 10 for chemically processing a substrate 20 according to the invention. FIGS. 2a,b,c show schematically and exemplarily different embodiments of the invention in a cross section through a module 10 for chemically processing a substrate 20, a side view and another cross section. The module 10 for chemically processing a substrate 20 comprises an immersion chamber 11, a spray unit 13, and a motion unit 14.

The substrate 20 is held by a substrate holder 21 or chuck and is inserted into the immersion chamber 11. The immersion chamber 11 may receive a chemical as a first liquid, so that the substrate 20 is immersed in the liquid. The substrate 20 may be processed on one or both sides. This means either one surface of the substrate or two surfaces of the substrate, the two surfaces being opposite to each other, may be processed.

Figure 3:
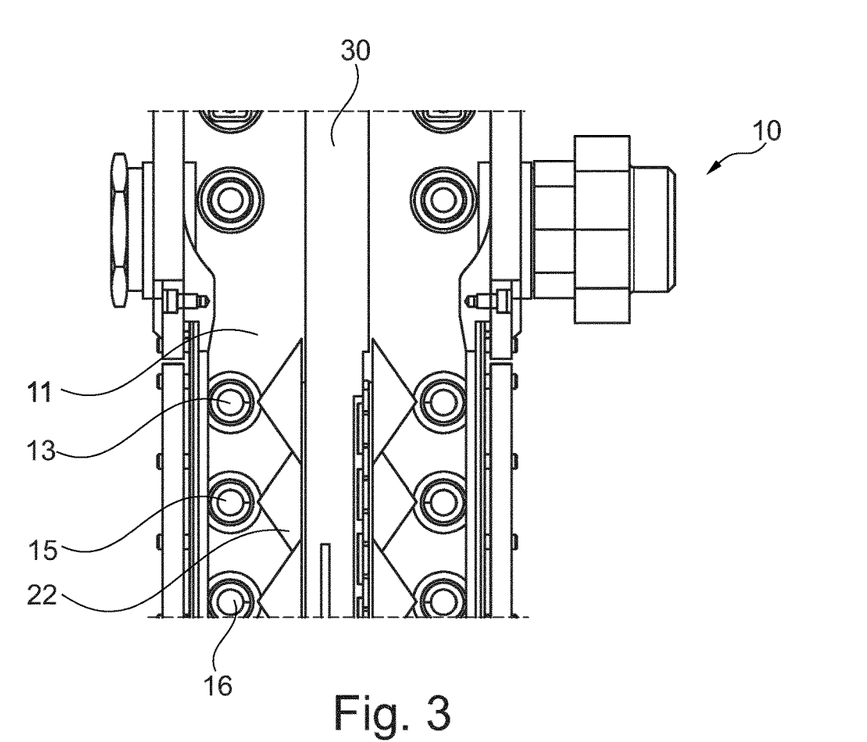
FIG. 3 shows schematically and exemplarily a detail of FIG. 2a with a focus on the spray unit.

The spray unit 13 comprises a plurality of spray nozzles 15, which spray a second liquid 22 within the immersion chamber 11 and onto the substrate 20, wherein the second liquid 22 hits the substrate 20 on both sides substantially perpendicular, thereby treating/processing the two opposite surfaces of the substrate. The first and second liquids 22 can be same or different. The spray nozzles 15 are arranged in spray bars 16, which are arranged along the two long side walls of the immersion chamber 11, the spray nozzles 15 being arranged opposite to each other and the substrate 20 being arranged in between, such that the spray nozzles spray the second liquid substantially perpendicular on the two opposite surfaces of the substrate 20. "Substantially perpendicular" can be understood not spraying of the liquid parallel to the substrate and preferably in a range of 70° to 110° to each of the surfaces of the substrate 20. The spray nozzles 15 may also be arranged in a wall of the immersion chamber 11. FIG. 3 shows schematically and exemplarily a detailed view of the spray unit 13. The spray nozzles 15 may be tilted relative to the substrate 20 or the immersion chamber 11 wall to direct the spray or to allow a draining. There are several options to achieve the tilt. For example, the spray nozzles 15 are tilted relative to the spray bar or the spray nozzles 15 are tilted relative to the chamber wall or the spray bars 16 are tilted relative to chamber wall or the like. Also, combinations are possible. The tilting movement preferably corresponds to a rotational movement around a Y-axis and/or a Z-axis (see FIG. 1).

As shown in FIGS. 1a,b and 2a,b,c, the motion unit 14 may provide a relative motion between the substrate 20 and the spray unit 13. The motion unit 14 may therefore move the substrate 20 including a substrate holder 21 and/or move the spray unit 13. To move the substrate 20 including the substrate holder 21, the motion unit 14 is shown in the drawings as portal or framework to enable an up and down movement of the substrate 20 in a Z-direction.

Moving the spray unit 13 may be understood as moving spray nozzles 15 and/or spray bars 16 of the spray unit 13 relative to the substrate 20 or the wall of the immersion chamber 11. The spray nozzles 15 and/or spray bars 16 may be moved to direct the spray of liquid with a certain angle onto the substrate 20 or into the immersion chamber 11. The purpose may be to chemically process the substrate 20 or to clean the substrate 20, the immersion chamber 11 and/or other components of the module 10. The purpose may also be to allow a gravitational draining of liquids out of the spray nozzles 15 and/or spray bars 16. Therefore, the spray bars 16 may be rotated around their respective longitudinal axis. The spray bars 16 may also conduct a fanning movement perpendicular to the longitudinal axes of the spray bars 16. This can be understood as a left—right movement when looking along the Y-direction and the width of the substrate 20 and the immersion chamber 11.

Moving the substrate 20 may be understood as moving the substrate 20 including a substrate holder 21 relative to the immersion chamber 11 and relative to the spray unit 13 in a first Z-direction vertically in and out of the immersion chamber 11, in a second X-direction direction horizontally in the direction of thickness of the substrate 20 from a front side to a back side of the substrate, and/or in a third Y-direction horizontally in the direction of width of the substrate 20.

The module 10 for chemically processing a substrate 20 further comprises an ultrasonic unit 12 to provide ultrasound to agitate the first liquid in the immersion chamber 11. The ultrasonic unit 12 may comprise one full area transducer or a plurality of smaller transducers. Here, as shown in the drawings, two full area transducers are provided as ultrasonic unit 12. The transducer(s) may be directly connected to the immersion chamber 11 or indirectly by means of a transducer plate. The transducer(s) may be arranged at an outer surface of the immersion chamber 11 or may be arranged between adjacent spray bars 16 of the spray unit 13. Here, as shown in the drawings, the two transducers of the ultrasonic unit 12 arranged at outer (lateral) surfaces of the immersion chamber 11.

As a result, an "All-in-One" multi-purpose module 10 or process chamber for liquid processing is provided, which is able to integrate diverse process technologies. For example, the application of immersion type processing, liquid spray processing (sequentially or at the same time/in parallel) and ultrasonic agitation within the same chamber is possible. In addition, an efficient and effective rinsing and drying without the need to move the substrate 20 in-between different processing vessels is achieved. The "All-in-One" multi-purpose module 10 allows, at the same time, accelerating many procedures and improving the product quality, while costs are still reduced. Further, many different substrate sizes may be processed without the need of mechanical changes to the chamber.

Figure 1B:
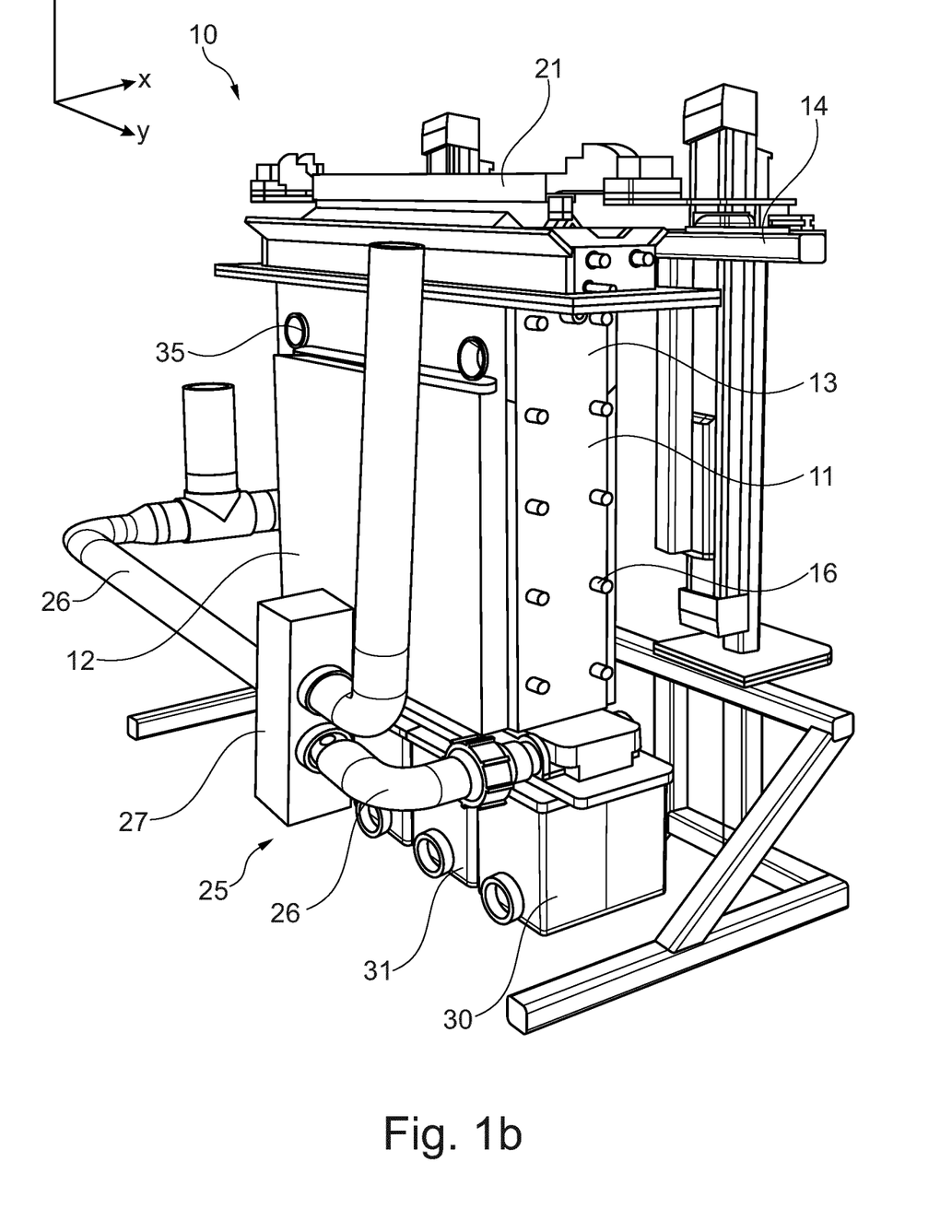
Figure 2A:
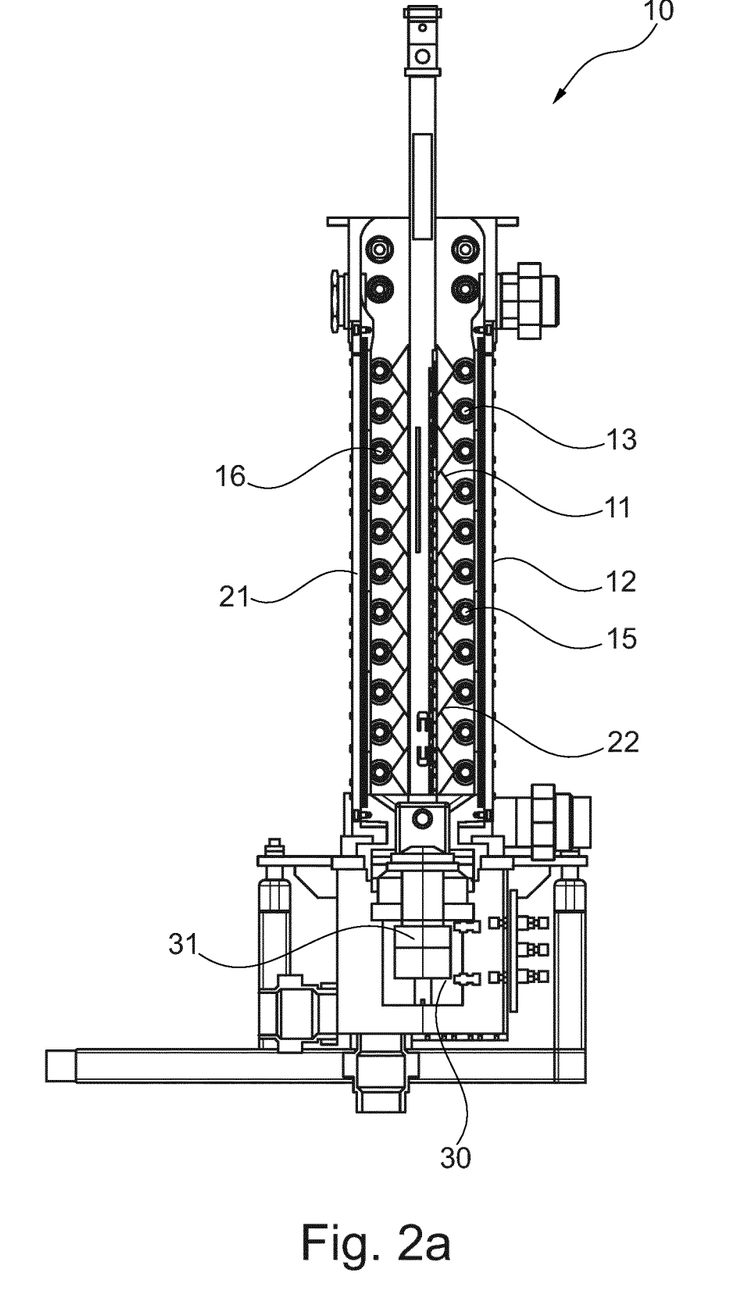
FIGS. 2a,b,c show schematically and exemplarily cross sections through a module for chemically processing a substrate and a side view of a module for chemically processing a substrate according to the invention.
Figure 2B:
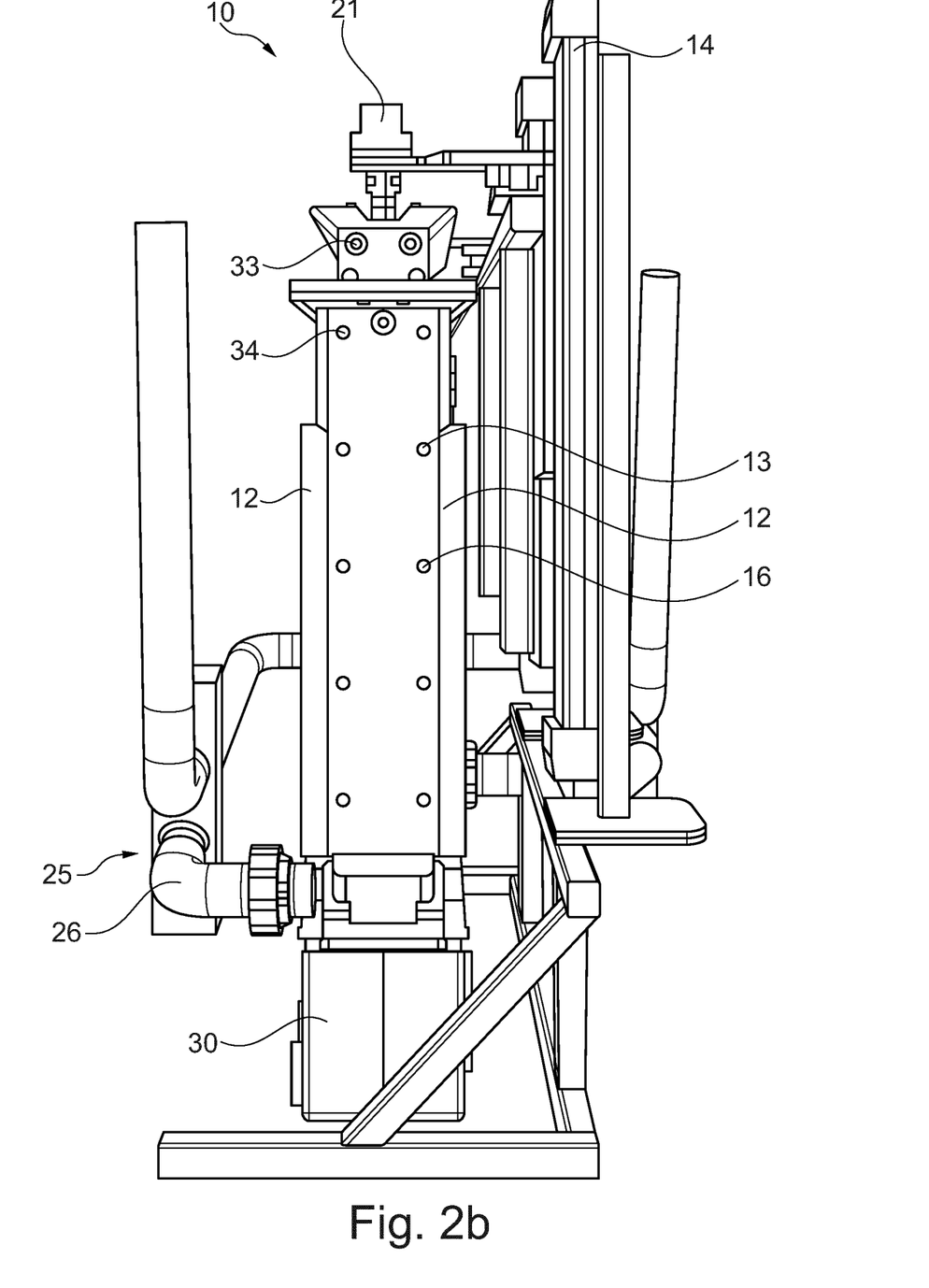
Figure 2C:
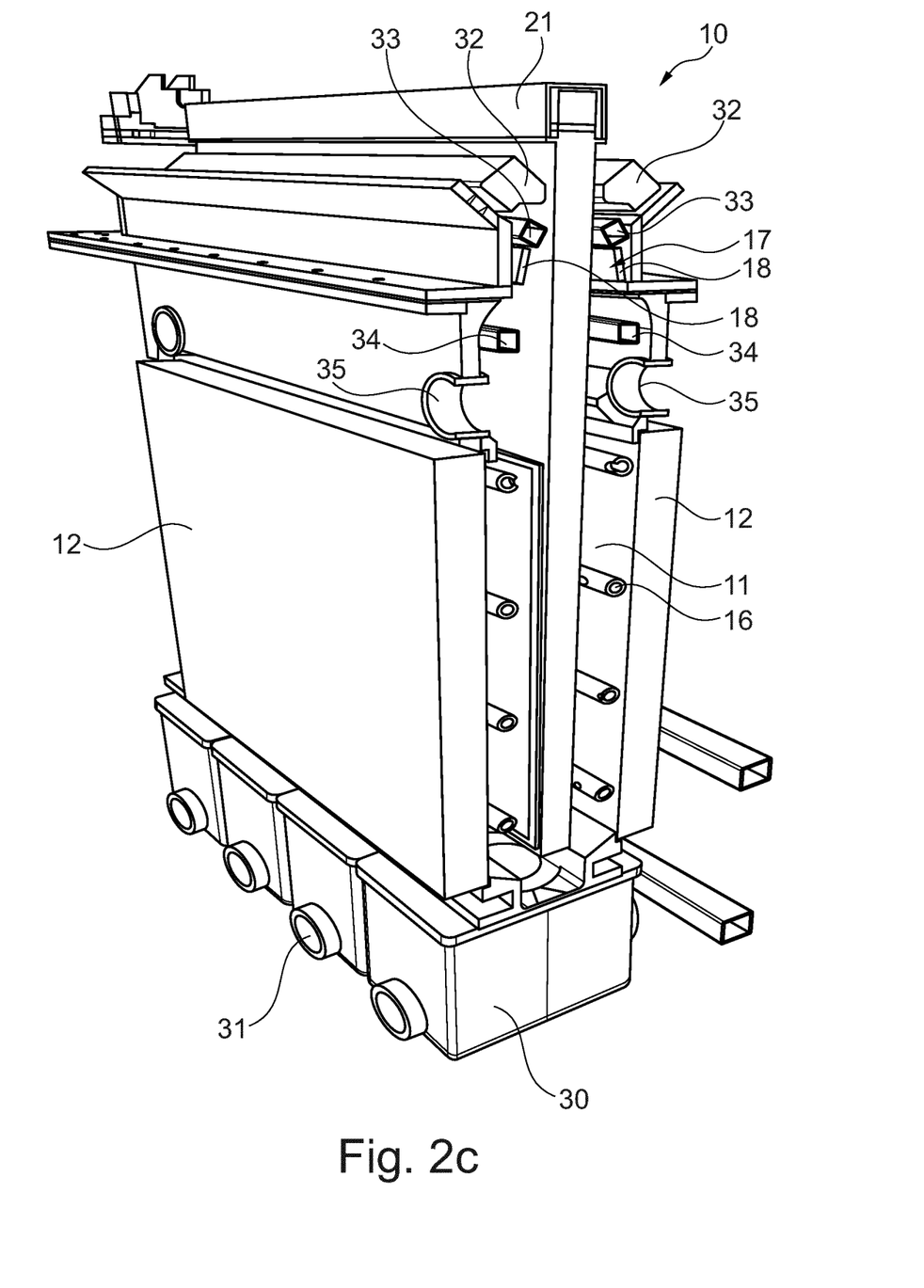

As shown in FIGS. 1b and 2b,c, the module 10 for chemically processing a substrate 20 further comprises an exhaust unit 25 for an exhaust flow during e.g. substrate drying. The exhaust unit 25 comprise here a bottom exhaust, which is arranged at the bottom of the immersion chamber 11. The exhaust unit 25 comprises an exhaust valve and several exhaust lines 26. The exhaust lines 26 with the capability of being rinsed, flushed or filled with a liquid or gas. The exhaust valve is here switchable between different exhaust lines 26.

The module 10 for chemically processing a substrate 20 further comprises a drain, rinse and dry unit. The drain, rinse and dry unit is configured to control a draining, a rinsing and/or a drying e.g. in-between chemicals or after a process step is completed. The drain, rinse and dry unit may be further controlled to blow and/or to suck liquid and/or gas in and/or out of the immersion chamber 11 and/or the spray unit 13. As an example, the drain, rinse and dry unit allows a back suction of liquids from the spray bars 16 and/or spray nozzles 15 and/or a blow-out of chemicals from the spray bars 16 sequentially or simultaneously.

As shown in FIGS. 1b and 2b,c, the drain, rinse and dry unit here further comprise air-knifes 32 for e.g. drying the substrate 20 and/or the substrate holder 21. The air-knifes 32 are shown in FIG. 2c and provide a laminar flow from top down while the substrate 20 and/or substrate holder 21 moves (repeatable) through a drying zone on top of the immersion chamber 11.

The drain, rinse and dry unit here further comprises waterfall elements 33, 34. Waterfall elements 33, 34 can be understood as spray or nozzle bars or slit bars providing liquid in the form of a waterfall. Upper waterfall elements 33 are arranged in an upper part of a chamber cover unit 17 to allow a cleaning of moveable cover elements 18 of the chamber cover unit 17 and/or the immersion chamber 11. Lower waterfall elements 34 are arranged in the immersion chamber 11 at e.g. two opposite sides to enable a waterfall-rinsing, waterfall-chemical processing, waterfall quenching etc. The lower waterfall elements 34 provide water or chemicals to flow from top of the substrate to the bottom by the action of gravity. They can also be used to rinse and clean the immersion chamber 11. The drain, rinse and dry unit here further comprises overflows 35 as a liquid level overflow below e.g. the top two waterfall spray or nozzle bars 33, 34.

Figure 4:
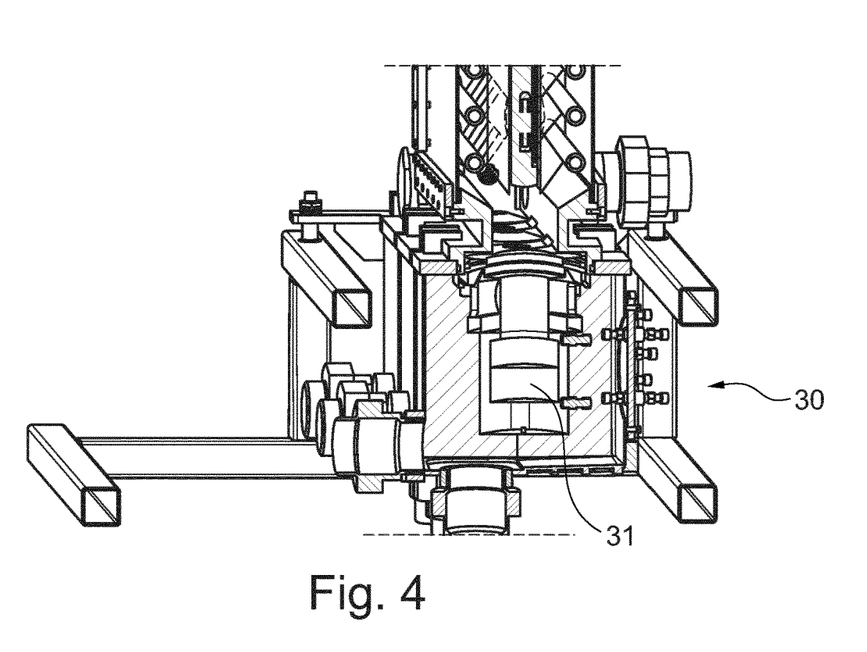
FIG. 4 shows schematically and exemplarily a detailed view with a focus on the valve unit.

The module 10 for chemically processing a substrate 20 further comprises a valve unit 30. FIG. 4 shows schematically and exemplarily a detailed view of the valve unit 30. The valve unit 30 is here a quick dump and rinse (QDR) valve block for liquid drain and gas exhaust. The valve unit 30 has several valves 31. Each valve 31 is connected to a separate tank or drain. The valves 31 are arranged at a bottom or lower end of the immersion chamber 11. The lowest point for liquids inside the module 10 is inside the valves 31. As a result, gravity drain can be used.

Figure 5:
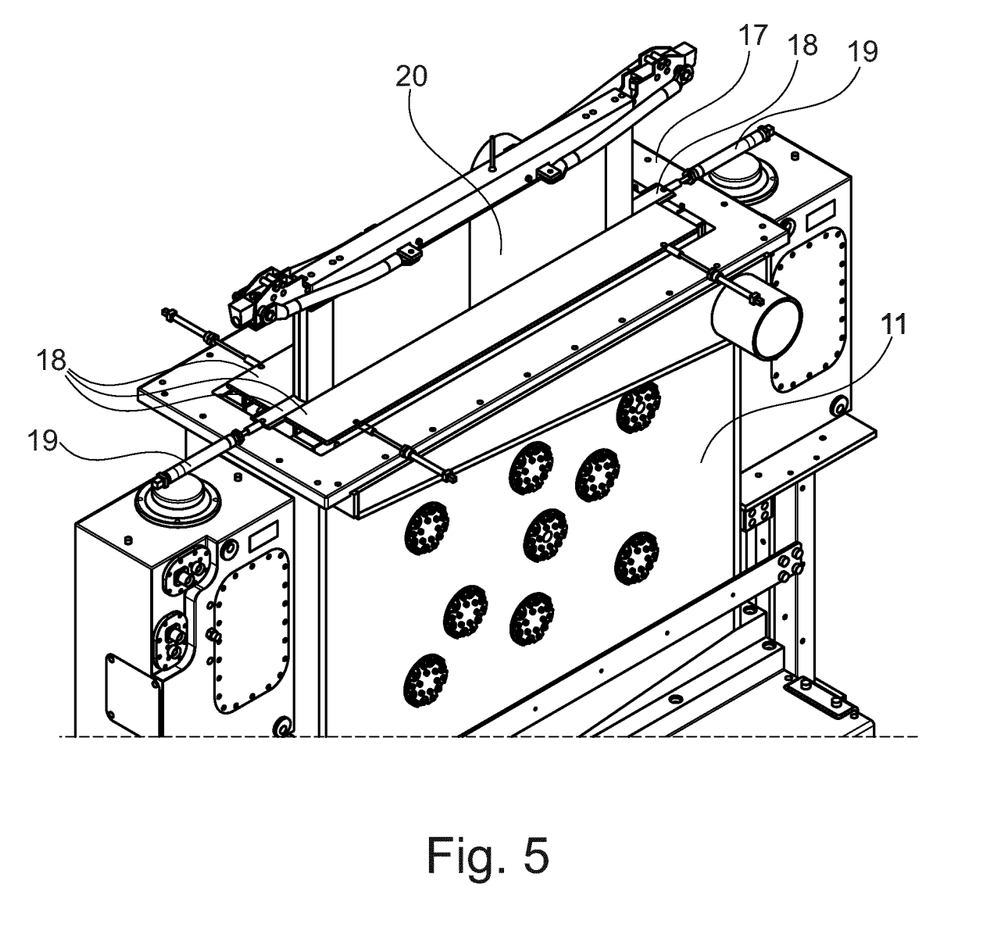
FIG. 5 shows schematically and exemplarily a detailed view with a focus on the chamber cover unit.

FIG. 5 shows schematically and exemplarily a detailed view of a chamber cover unit 17. The module 10 for chemically processing a substrate 20 further comprises a chamber cover unit 17 comprising four moveable cover elements 18. The moveable cover elements 18 can close an opening on top of the immersion chamber 11 to a closed position. The moveable cover elements 18 can further sur- round a substrate 20 while transferred through the opening in close contact in a transfer position. The moveable cover elements 18 can further open the opening in an open position. The moveable cover elements 18 are pushed against the substrate 20 or the substrate holder 21 by e.g. pneumatic cylinders 19.

In the closed position, the moveable cover elements 18 are sealed against the immersion chamber 11 or a rim or contact surface of the immersion chamber 11. The sealing between the moveable cover elements 18 and the immersion chamber 11 is essentially liquid and gas tight to avoid e.g. an escape of toxic gas. The sealing can be done by means of sealing elements as e.g. at least an elastic lip, a labyrinth seal and/or the like. The sealing can also be done by means of

- an expandable sealing, which is particular easy to implement,
- an encapsulation of an upper area or the tank, which can be easily made entirely tight,
- a collar joint with a liquid basin, which can easily handle all kinds of motions of the module 10,
- an adjustable cover,
- a cover covering essentially the entire upper part of the substrate holder 21 and being moveably in horizontal and vertical directions by means of e.g. rails and a step motor as well as moveable nozzles,
- spring loaded vertical blinds e.g. coupled to the substrate holder 21, which can be easily made entirely tight,
- a complete encapsulation of the motion unit 14 and of a loading position of the substrate holder 21, which can be easily made entirely tight and which can easily handle all kinds of motions of the module 10,
- an air curtain, allowing large movements,
- a simple cover for a fixed substrate holder 21 with several spray nozzles 15, which might be moved, tilted and/or rotated in arbitrary positions and which can be separately controlled,
- another simple cover for a fixed substrate holder 21 with several spray nozzles 15, wherein the spray nozzles 15 are arranged at a manifold or a plate within the immersion chamber 11 and can be horizontally and vertically displaced by means of e.g. a thrust rod,
- etc.

In the transfer position, the moveable cover elements push against the substrate and a gap opens between the moveable cover elements and the rim of the immersion chamber. The gap is controlled by a flow of sealing gas from the outside to the inside of the immersion chamber to prevent a contaminating gas flow from the inside to the outside. The gap is not mechanically closed.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A module for chemically processing a substrate, comprising:
    an immersion chamber,
    a spray unit, and
    a motion unit,
    wherein the immersion chamber is configured to receive a first liquid and the substrate, so that the substrate is immersed in the first liquid,
    wherein the spray unit comprises a plurality of spray nozzles, which are configured to spray a second liquid within the immersion chamber,
    wherein the motion unit is configured to provide a relative motion between the substrate and the spray unit, and
    wherein the spray unit extends along the substrate to be processed such that the second liquid is sprayed on the substrate substantially in a thickness direction of the substrate,
    wherein the plurality of spray nozzles of the spray unit are arranged in several rows in the immersion chamber along a height direction of the immersion chamber, and
    wherein the spray nozzles are at least partially arranged in a wall of the immersion chamber.

2. The module according to claim 1, further comprising an ultrasonic unit configured to provide ultrasound to agitate the first liquid in the immersion chamber.

3. The module according to claim 2, wherein the ultrasound unit and the spray unit are at least partially arranged at a removable plate element configured to be moved relative to the immersion chamber.

4. The module according to claim 1, further comprising an exhaust unit comprising an upper exhaust arranged above the first liquid and a bottom exhaust arranged at the bottom of the immersion chamber.

5. The module according to claim 1, wherein the motion unit is configured to move the substrate relative to the immersion chamber in a first direction in and out of the immersion chamber and to move the substrate relative to the immersion chamber in another direction perpendicular to the first direction.

6. The module according to claim 1, wherein the spray nozzles are at least partially arranged in spray bars.

7. The module according to claim 1, wherein the spray unit is configured to spray the second liquid in a spray direction, which is non-perpendicular tilted relative to a wall of the immersion chamber and directed towards a bottom of the immersion chamber.

8. The module according to claim 1, wherein in a row of adjacent first, second and third spray nozzles, the first and third spray nozzles are tilted similar and the second spray nozzle is arranged differently to the first and third spray nozzles.

9. The module according to claim 1, further comprising a chamber cover unit comprising several cover elements configured to close an opening in the immersion chamber in a closed position and to surround a substrate to be transferred through the opening in a transfer position.

10. The module according to claim 9, wherein the chamber cover unit is further configured to open the opening in an open position.

11. The module according to claim 9, wherein the chamber cover unit further comprises a processing element configured to control a movement of the chamber cover elements depending on motion data received from the motion unit controlling the relative motion between the substrate and the spray unit.

12. The module according to claim 1, further comprising a drain, rinse and dry unit configured to blow and/or to suck liquid and/or gas in and/or out of the immersion chamber and/or the spray unit.

13. The module according to claim 12, wherein the drain, rinse and dry unit is configured for waterfall-rinsing, waterfall-chemical processing and/or waterfall quenching.

14. The module according to claim 12, wherein the drain, rinse and dry unit comprises a temperature controlling element configured to heat or cool the liquid and/or gas to be blown or sucked through the immersion chamber and/or the spray unit.

15. The module according to claim 1, wherein the plurality of spray nozzles are arranged in the immersion chamber such that they are horizontally and vertically aligned.

16. A method for chemically processing a substrate, comprising the following steps, not necessarily in this order:
    inserting a first liquid and a substrate into an immersion chamber, so that the substrate is immersed in the first liquid,
    removing the first liquid from the immersion chamber,
    spraying a second liquid within the immersion chamber on the substrate in a thickness direction of the substrate by means of a spray unit comprising several rows of spray nozzles, arranged in the immersion chamber along a height direction of the immersion chamber, wherein the spray nozzles are at least partially arranged in a wall of the immersion chamber, and
    relatively moving the substrate and the spray unit by means of a motion unit.

17. The method according to claim 16, wherein the spraying of the second liquid is done while the substrate is at least partially immersed in the first liquid and before removing the first liquid from the immersion chamber.

18. The method according to claim 16, further comprising the step of removing the substrate out of the immersion chamber while rinsing the immersion chamber for a subsequent processing of the same substrate.

19. The method according to claim 16, wherein the plurality of spray nozzles are arranged in the immersion chamber such that they are horizontally and vertically aligned.

* * * * *